US009740801B2

(12) United States Patent
Singh et al.

(10) Patent No.: US 9,740,801 B2
(45) Date of Patent: Aug. 22, 2017

(54) OPTIMIZATION FOR COOLING

(75) Inventors: Umesh Singh, Pune (IN); Amarendra Kumar Singh, Pune (IN); Anand Sivasubramaniam, Chennai (IN)

(73) Assignee: Tata Consultancy Services Limited, Mumbai (IN)

( * ) Notice: Subject to any disclaimer, the term of this patent is extended or adjusted under 35 U.S.C. 154(b) by 736 days.

(21) Appl. No.: 14/342,472

(22) PCT Filed: Aug. 29, 2012

(86) PCT No.: PCT/IN2012/000573
§ 371 (c)(1),
(2), (4) Date: Mar. 3, 2014

(87) PCT Pub. No.: WO2013/046227
PCT Pub. Date: Apr. 4, 2013

(65) Prior Publication Data
US 2014/0207424 A1 Jul. 24, 2014

(30) Foreign Application Priority Data
Sep. 3, 2011 (IN) .......................... 2459/MUM/2011

(51) Int. Cl.
G06F 17/50 (2006.01)
G06F 1/20 (2006.01)

(52) U.S. Cl.
CPC ............ G06F 17/5004 (2013.01); G06F 1/20 (2013.01); G06F 17/5009 (2013.01)

(58) Field of Classification Search
CPC ..... G06F 17/5004; G06F 17/5009; G06F 1/20
USPC .......................................................... 703/1
See application file for complete search history.

(56) References Cited

U.S. PATENT DOCUMENTS

| 7,832,925 B2 * | 11/2010 | Archibald | G06F 1/20 165/287 |
| 7,881,910 B2 * | 2/2011 | Rasmussen | G06F 1/206 361/695 |
| 7,979,250 B2 * | 7/2011 | Archibald | G06F 17/5004 361/600 |
| 7,991,592 B2 * | 8/2011 | VanGilder | H05K 7/20836 361/688 |

(Continued)

OTHER PUBLICATIONS

Shrivastava, VanGilder, and Sammakia, "Optimization of cluster cooling performance for data centers", 2008, 11th Intersociety Conference on Thermal and Thermomechanical Phenomena in Electronic Systems, ITHERM, IEEE, pp. 1161-1166.*

(Continued)

*Primary Examiner* — Kamini S Shah
*Assistant Examiner* — Juan Ochoa
(74) *Attorney, Agent, or Firm* — Schwegman Lundberg & Woessner, P.A.

(57) ABSTRACT

A design optimization system (100) and a method for achieving design optimization for cooling are described herein. According to an implementation, the method includes obtaining an inlet value of at least one flow parameter at a small geometric length scale and determining an outlet value of the at least one flow parameter at the small geometric length scale based on the inlet value. Further, a flow behavior is modeled based on the inlet and outlet values of the at least one flow parameter, and based on the modeled flow behavior an optimized design for cooling is ascertained.

9 Claims, 4 Drawing Sheets

(56) References Cited

U.S. PATENT DOCUMENTS 8,306,794 B2 * 11/2012 Hamann .................. G06F 1/206
 703/5
8,712,735 B2 * 4/2014 VanGilder .......... H05K 7/20836
 703/1

OTHER PUBLICATIONS

Jeffrey D. Rambo, Reduced-order modeling of multiscale turbulent convection application to data center thermal management, 2006, Dissertation Georgia Institute of Technology, pp. 1-123.*

Singh et al., "CFD-Based Operational Thermal Efficiency Improvement of a Production Data Center", 2010, SustainIT, pp. 1-7.*

"International Application Serial No. PCT/IN2012/000573, International Prelimiinary Report on Patentability dated Mar. 4, 2014", 10 pgs.

"International Application Serial No. PCT/IN2012/000573, International Search Report mailed Aug. 26, 2013", 2 pgs.

"International Application Serial No. PCT/IN2012/000573, Written Opinion mailed Aug. 26, 2013", 9 pgs.

Abdelmaksoud, W. A., et al., "Improved CFD modeling of a small data center test cell", *Intersociety Conference on Thermal and Thermomechanical Phenomena in Electrical Systems (ITHERM)*, (2010), 1-9.

Fakhim, B., et al., "Cooing solutions in an operational data centre: A case study", *Applied Thermal Engineering*, 31(14-15), (2011), 2279-2291.

Karki, K. C., "Airflow distribution through perforated tiles in raised-floor data centers", *Building and Environment*, 41(6), (2006), 734-744.

Song, Z., et al., "Multivariate Prediction of Airflow and Temperature Distributions Using Artificial Neural Networks", *ASME 2011 Pacific Rim Technical Conference and Exhibition on Packaging and Integration of Electronic and Photonic Systems, MEMS and NEMS*, vol. 2, (2011), 595-604.

* cited by examiner

OPTIMIZATION FOR COOLING

PRIORITY APPLICATIONS

This application is a U.S. National Stage Filing under 35 U.S.C. 371 from International Application No. PCT/IN2012/000573, filed on 29 Aug. 2012, and published as WO 2013/046227 on 4 Apr. 2013, which application claims the benefit of priority under 35 U.S.C. 119 to Indian Patent Application No. 2459/MUM/2011, filed on 3 Sep. 2011; which applications and publication are incorporated herein by reference in their entirety.

TECHNICAL FIELD

The present subject matter relates, in general, to design optimization and, in particular, to design optimization for cooling.

BACKGROUND

With an increase in computing capabilities, energy usage by the computing equipments has increased tremendously in data centres. Studies have shown that the average data centre heat load densities are on the rise and loads at high-density data centres are as high as 10000 W/m$^2$ and more. The pace of introduction of high capability equipment in the data centre is far more frequent compared to the changes made in basic layout design of the facility. This results in generation of higher amount of heat inside the data centre. While high heat load densities in data centres generally pose problems of over-heating or insufficient cooling, the situation frequently leads to overt over-cooling, thereby unnecessarily increasing the share of cooling needs in the overall power usage.

Efficient energy management of data centres, thus, represents a dual challenge, considering the ever-increasing serve r heat loads on one hand, and the need for energy efficient cooling on the other. Generally, to avoid such cooling inefficiencies, airflow path and temperature distribution in the data centres are analyzed. The usual methods of guidelines-based design modification and measurement-based design optimizations have major limitations because of the complexity of air flow path and temperature distribution. On the other hand, physics-based modeling techniques, such as computational fluid dynamics, which can provide detailed view of airflow path and spatial variation of temperature distribution in a data centre, are conventionally used for operational design for cooling of data centres.

SUMMARY

This summary is provided to introduce concepts related to optimization of data centre for cooling, which are further described below in the detailed description. This summary is not intended to identify essential features of the claimed subject matter nor is it intended for use in determining or limiting the scope of the claimed subject matter.

Methods and systems for achieving design optimization for cooling are described herein. In one implementation, a method for achieving design optimization for cooling includes obtaining an inlet value of one or more flow parameters at a small geometric length scale and determining an outlet value of the flow parameters at the small geometric length scale based on the inlet value. Further, a flow behaviour is modeled based on the inlet and outlet values of the flow parameters. In another implementation, the modeled flow behavior of smaller length scale is integrated into model at large geometric length scale to provide accurate flow behaviour and optimized design for cooling.

BRIEF DESCRIPTION OF THE DRAWINGS

The detailed description is described with reference to the accompanying figure(s). In the figure(s), the left-most digit(s) of a reference number identifies the figure in which the reference number first appears. The use of the same reference number in different figure(s) indicates similar or identical items. The features, aspects and advantages of the subject matter will be better understood with regard to the following description, and the accompanying drawings.

DETAILED DESCRIPTION

Figure 1:
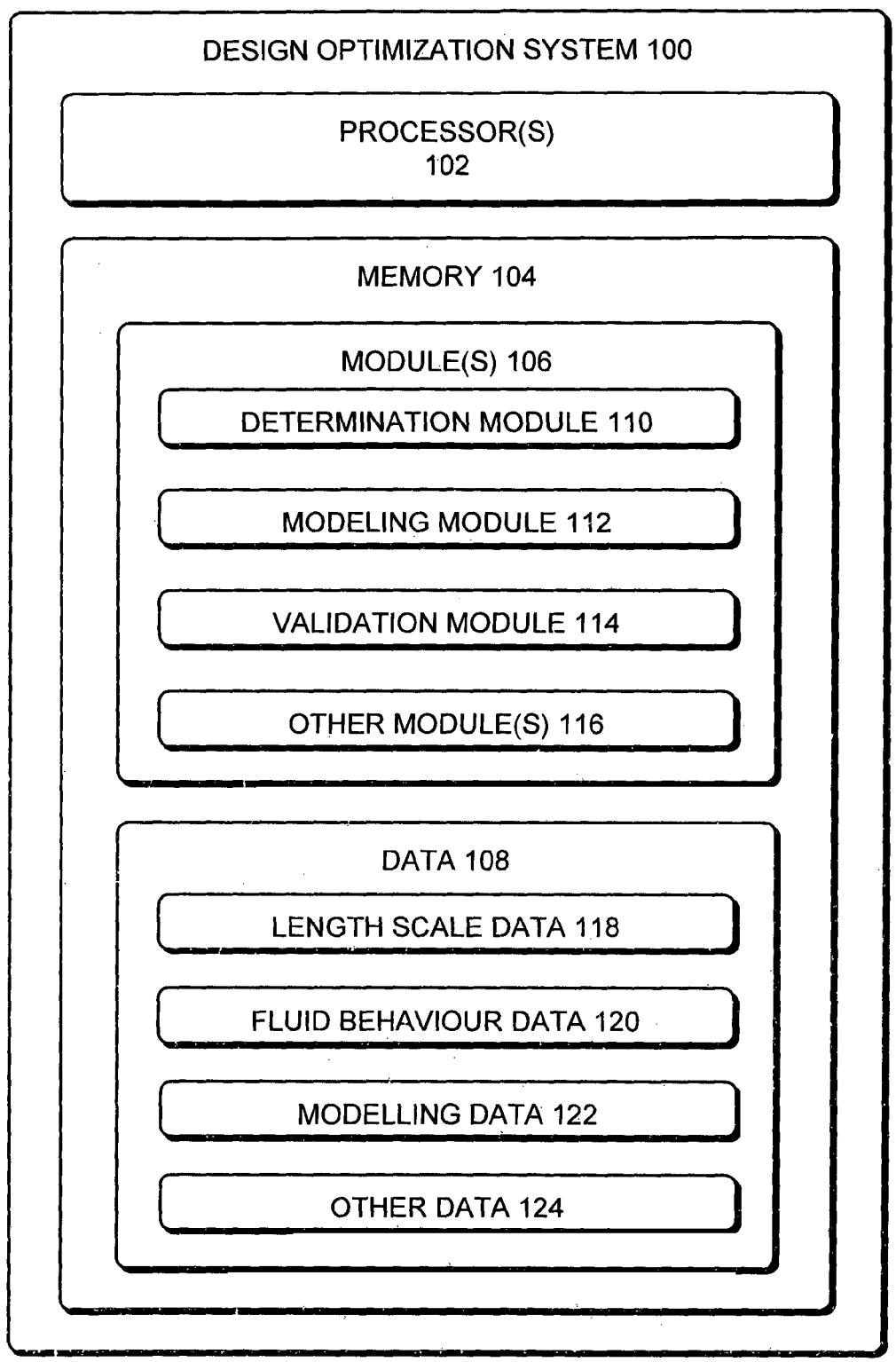
FIG. 1 illustrates a design optimization system to optimize design for cooling, in accordance with an embodiment of the present subject matter.

The subject matter described herein relates to systems and methods for achieving design optimization for cooling in, for example, a data centre.

In general, data centres housing high-performance computing equipment are designed to provide cooling for efficient operation of the computing equipment. With an increase in computing capabilities, energy usage by the computing equipments has increased tremendously in data centres. This results in generation of higher amount of heat inside the data centre. These high heat load densities in data centres generally pose problems of over-heating or insufficient cooling. To circumvent this situation, cooling power is provided to bring these overheated regions, also known as hot spots, within acceptable limits of temperature. However, owing to the complex geometries of flow path of air in data centres, this invariably results in under-cooled regions and inefficient operation of the data centres. Conventionally, physics-based models, such as computational fluid dynamics (CFD) based models, are used for obtaining thermal and flow profiles and for designing the data centres.

In data centres, the overall thermal and flow profiles of a circulating cooling medium, for example, air, are dependent on physical phenomena occurring at multiple geometric length scales of the equipments and of the data centre itself. While designing the data centre and the cooling system based on CFD-based analysis, accounting for thermal and flow phenomena at various geometric length scales are important from the perspective of solution accuracy.

One of the most accurate ways of modeling is a multi-scale approach in which components at different geometric length scales are modeled separately, with the maximum degree of details possible at various length scales. For example, for a data centre the components at different geometric length scales can include processor chips, servers, equipment racks, and room level length scales. Accurate inter-scale energy transfer is then implemented by exchanging boundary conditions as appropriate. In this manner, the accuracy of simulation is ensured, from the smallest to the largest length scales. This leads to system-wide improvement in predictive power and solution effectiveness. However, computing the thermal and fluid flow parameters through considerations of thermal and flow behaviour at multiple geometric length scales of the data centre is usually impractical considering huge computational time and resources required.

Thus, for depicting the flow and thermal behaviour at the level of entire data centre, CFD analysis is often performed at larger geometric length scales. In such cases, the phenomena occurring at lower length scales is incorporated into the model using approximations. For example, often the entire equipment rack is treated as a heat source and the heat distribution inside the rack is not considered while computing thermal and flow profile at data centre level. Similarly, flow behavior at the vent-tile level is depicted using empirical models, such as Darcy law owing to the smaller length scales involved. Use of such approximations reduces the computational time at the cost of solution accuracy. Design based on such solutions is, therefore, non-optimal.

The present subject matter relates to a method and a system for achieving efficient and accurate design optimization for optimum cooling of data centre. The method involves efficient incorporation of accurate physics at lower geometric length scales into flow modeling at higher geometric length scale resulting in a system which captures flow physics at multiple length scales without compromising on computational cost. This system thus arrived is computationally efficient and physically more accurate for efficient and robust design and operation of data centre.

According to the present subject matter, a small data centre is chosen where physics-based models are employed at multiple length scales. In other words, this model involves accurate modeling instead of using approximate models at lower length scales, and the impact of physical phenomena at lower length scale is correctly transferred to higher length scales. The model implemented in computational fluid dynamics (CFD) framework can be based on the conservation of energy and momentum (Navier-Stokes' equations) and accounts for the flow behavior at multiple length scales by refining the mesh.

Further, this model can correctly depict the flow across a vent-tile and perform numerical simulation for different fluid parameters, such as flow rates and orientation of air conditioning vents. These simulations provide the information on pressure conditions and velocities across vent-tile for different operating parameters and simulations are performed to generate these data for wide range of operating conditions. In an implementation, velocities at the inlet of the vent-tile, velocities at the outlet of the vent-tile and pressure difference across vent-tile are provided as inputs to a data-based modeling framework, such as artificial neural network (ANN) based tool, to develop an empirical model correlating velocities across vent-tiles. In order to achieve the desired accuracy of the fluid behaviour, the ANN based tool is used to train and obtain an empirical model using large number of simulated data relating to the inlet and the outlet values of the flow parameters obtained form the model which accounts for flow behavior at smaller length scale. Empirical model thus obtained is tested on a fresh set of data. In an example, based on the training of the empirical model, various governing relations of linear nature or non-linear nature or both between the inlet and outlet values of the flow parameters are captured in the empirical model.

For a full data centre, the model is implemented at larger length scales, subsequent to incorporating the ANN based model for critical parts, such as vent-tile where small length scale resolutions are required. In one implementation, the results of the empirical model are integrated with a full-scale physics-based model to obtain the values of the fluid phenomena at the large geometric length scales. In an example, an empirical model for the vent-tile, which takes the velocity components at the inlet of vent-tile and provides the velocity components at the outlet of the vent-tile, is integrated into the fill-scale physics-based model, such as the CFD model, and the accurate values of fluid and thermal parameters are obtained for the full-scale data centre. The fluid parameters can include the parameters that are a property of the fluid, such as velocity and pressure, and the thermal parameters can include parameters that are related to thermal properties of the fluid, such as temperature and heat transfer coefficient. These fluid parameters and thermal parameters, collectively referred to as flow parameters, can include flow rates, temperatures, pressures, and velocity components; at various locations at, for example, inlet of the rack equipment and outlet of the vent-tile. Based on the full-scale physics-based model, the output flow behaviour properties in the data centre are computed and accordingly the design and layout of the data centre is optimized. In another example, thermal phenomena at various length scale from chip to rack levels can be brought into models at larger length scale using similar approach.

With the use of the empirical model for modeling the fluid behaviour at small geometric length scales, the modeling of the fluid behaviour for large data centre is achieved with less computational resources and time, without compromising on the accuracy of results. Further, since modeled data is used in the physics-based modeling tool to obtain the flow parameters at large geometric length scales, an accurate design of the data centre is obtained. The improved predictive power of the model results in more accurate design and optimized cooling of the data centre.

While aspects of described systems and methods for design optimization for cooling can be implemented in any number of different computing systems, environments, and/or configurations, the embodiments are described in the context of the following system architecture(s).

FIG. 1 illustrates a design optimization system 100 to achieve optimized design for cooling in a data centre. The data centre can include a plurality of computing equipments and a cooling system for cooling the computing equipment. The design optimization can be achieved for the design of the data centre. The design of the data centre can include geometry and position of equipment racks on which the computing equipment are placed and design and layout of the cooling system including cooling plenums, ducts, vents, and vent-tiles.

In an implementation, the design optimization system 100 can be implemented as a variety of computing devices, including, for example, servers, desktop PCs, notebooks or portable computers, workstations, mainframe computers, mobile computing devices, cellular phones, entertainment devices, PDAs, and internet appliances.

Further, in one implementation, the design optimization system 100 includes a processor 102 and memory 104. The processor 102 can be a single processing unit or a number of units, all of which could include multiple computing units. The processor 102 may be implemented as one or more microprocessors, microcomputers, microcontrollers, digital signal processors, central processing units, state machines, logic circuitries, and/or any devices that manipulate signals based on operational instructions. Among other capabilities, the processor 102 is configured to fetch and execute computer-readable instructions and data stored in the memory 104.

The memory 104 may include any computer-readable medium known in the art including, for example, volatile memory such as static random access memory (SRAM) and dynamic random access memory (DRAM), and/or non-volatile memory, such as read only memory (ROM), erasable programmable ROM, flash memories, hard disks, optical disks, and magnetic tapes.

Further, the memory 104 includes module(s) 106 and data 108. The module(s) 106 include routines, programs, objects, components, data structures, etc., which perform particular tasks or implement particular abstract data types. In one implementation, the module(s) 106 include a determination module 110, a modeling module 112, a validation module 114, and other modules 116. The other modules 116 may include programs or coded instructions that supplement applications and functions of the computing system 100, for example, programs in the operating system.

On the other hand, the data 108, amongst other things, serves as a repository for storing data processed, received, and generated by one or more of the module(s) 106. In one implementation, the data 108 includes length scale data 118, fluid behaviour data 120, modeling data 122, and other data 124. The other data 124 includes data generated as a result of the execution of one or more modules in the other modules 116.

Further, the design optimization system 100 can also include I/O interfaces (not shown in figure). The I/O interfaces may include a variety of software and hardware interfaces, for example, interface for peripheral device(s) such as a keyboard, a mouse, an external memory, a printer, etc. Further, the I/O interfaces may enable the computing system 100 to communicate with other computing devices, such as web servers and external databases. The I/O interfaces may facilitate multiple communications within a wide variety of protocols and networks. The I/O interfaces may include one or more ports for connecting the design optimization system 100 to a number of computing devices.

In one implementation, the design optimization system 100 is configured to simulate fluid behaviour at small geometric length scales and employ the simulated fluid behaviour in determining fluid behaviour at large length scales to optimize the design of the data centre for cooling. The design of the data centre can include geometric design and layout of equipment racks for computing equipment, and plenums, ducts, vents, and vent-tiles of cooling systems.

During operation, the determination module 110 generates and simulates fluid behaviour at small geometric length scales in a data centre for which the design is to be optimized in terms of cooling. Firstly, a small data centre is chosen where physics-based models are employed at multiple length scales. Details of geometry of vent-tile are incorporated in the model. This model can correctly depict the flow across a vent-tile and performing numerical simulation for different flow parameters, such as flow rates and orientation of AC vent. These simulations provide the information on pressure conditions and velocities across vent-tile for different operating flow parameters and simulations are performed to generate these data for wide range of operating conditions.

In an implementation, the determination module 110 can simulate the data centre at small length scale based on inputs received from a user. These inputs can include geometric details of the data centre, the equipment racks, the plenums, ducts, vents, and vent-tiles of the cooling system provided in the data centre for cooling the data centre according to a scale smaller than the actual size. Further, the inputs can include inlet values of flow parameters that influence fluid flow and thermal properties of a cooling medium, such as air, circulating in and cooling the data centre. In one example, the input can include inlet values of temperature and humidity, actual flow rates and velocities of the cooling medium measured along different directions in 3-dimensional space, and pressure conditions measured at predetermined locations in the data centre. The values of the flow parameters can also be the actual measured values in the data centre. In an implementation, the determination module 110 can interact with various sensors placed in the data centre to obtain the inlet values of the flow parameters at, for example; at chip level and at vent-tile level. The determination module 110 can store the inputs from the users in the length scale data 118.

Subsequent to the generation of the small-scale model of the data centre, the determination module 110 is configured to determine values of flow parameters that influence flow and thermal properties of a cooling medium, such as circulating air. The flow parameters can include fluid and thermal parameters, for example, temperature and humidity, actual flow rates and velocities of the cooling medium measured along different directions in 3-dimensional space, and pressure conditions measured at predetermined locations in the data centre.

Subsequent to obtaining the inlet values for flow parameters at the inlet of the components with small geometric length scales in the small scale data centre, the determination module 110 is configured to determine outlet values of the flow parameters at the small geometric length scales based on the inlet values of the flow parameter at small geometric length scales. In an implementation, the determination module 110 can determine values of the flow parameters at exit of the various data centre components, such as at exit of vent tiles, at exit of equipment racks, and at exit of plenums.

In said implementation, the determination module 110 determines the flow parameters based on the application of a physics-based model on the inlet values of the flow parameters. In one example, the physics-based model is a computational fluid dynamics (CFD) model. In said example, the CFD model can be based on one or more relations of fluid dynamics, such as the Average Navier Stokes Equation, or modified variants of such relations, stored in the fluid behaviour data 120. The physics-based model and the included relations can be stored in the modeling data 122 for implementation by the determination module 110.

With the determination of the outlet values of the flow parameters, the determination module 110 achieves the determination of inlet and outlet values of flow parameters for the components with small geometric length scales in the data centre. In an implementation, the determination module 110 can store the inlet and outlet values of the flow parameters in the fluid behaviour data 120.

Further, in an implementation, the modeling module 112 is configured to employ the inlet and outlet values of the flow parameters in a data-based modeling framework to achieve the simulation of fluid behaviour at small length scales. In an example, the data-based modeling framework can be an artificial neural network (ANN) based model, stored in the modeling data 122. The data-based modeling framework is provided with the inlet and outlet values of the flow parameters at small geometric length scales as input. Based on the input, the data-based modeling framework can simulate the fluid behaviour by determining an empirical model. In an example, the data-based modeling framework can determine one or more correlations of the empirical model to demonstrate the flow parameter at the outlet based on the input flow condition to simulate the fluid behaviour at small geometric length scales. The correlations of empirical model can include a variety of linear and non-linear relations and can be stored along with the coefficients in the fluid behaviour data 120.

In an implementation, the modeling module 112 can be configured to select primary flow parameters based on the influence of the flow parameters on the properties and flow behaviour of the cooling medium, and also the location in the data centre at which the cooling influences the overall cooling of the data centre. For example, in certain cases when the cooling is pertinent at vent-tile level, the selected primary flow parameters can include flow rate and velocity of the cooling medium at the inlet side of the vent-tile. In certain other cases when the cooling is pertinent at chip level or at equipment rack level, the selected primary flow parameters can include the temperatures at various locations at the inlet side of the chip or the equipment rack.

Further, in an implementation, the empirical model is tested by the validation module 114 in order to check whether the fluid behaviour simulation is calculated accurately. In an implementation, the inlet values of the flow parameters is provided as input to the empirical model and the outlet values of the flow parameters are obtained from the empirical model, for example, based on the ANN based empirical correlations, for a fresh sets of data. Further, the validation module 114 compares the outlet values obtained from the empirical model with the earlier computed outlet values of the flow parameters obtained from the physics-based model, and based on the comparison of the two values, the validity of the empirical model is checked. For example, when the values of the outlet values are within a predetermined range of error tolerance with respect to the available outlet values from the physics-based model, the validation module 114 determines that the empirical model and hence the simulated fluid behaviour is correct and accurate.

Once the empirical model and the simulated fluid behaviour for small geometric length scales are validated, the modeling module 112 can be configured to compute outlet values of flow parameters at large geometric length scales for a full-scale data centre. In an implementation, the modeling module 112 is configured to integrate the simulated fluid behaviour depicted by the empirical model for small geometric length scales into a full-scale physics-based model and obtain an optimized design of the full-scale data centre at a large geometric length scale by computing the outlet values of the flow parameters. In an example, the modeling module 112 can embed the selected correlations of the empirical model tri the physics-based model to integrate the simulated fluid behaviour with the physics-based model.

In an implementation, the modeling module 112 can compute the outlet values of the flow parameters based on actual inlet values of the flow parameters at large geometric length scales. In an example, the flow parameters at large geometric length scales can include flow parameters at equipment rack level, plenum level, duct level, and vent level. In an embodiment, the inlet values of flow parameters pertaining to the large geometric length scales can be obtained by the modeling module 112 from various sensors and stored in the fluid behaviour data 120 and used by the modeling module 112. Further, the modeling module 112 can also request the flow parameters and measurements of the data centre and various components as inputs from the user.

Further, upon obtaining the final inlet values of the flow parameters for the large geometric length scale, the modeling module 112 can determine the final outlet values of the flow parameters based on the physics-based model having the empirical model integrated therein, also referred to as integrated physics-based model. Based on the final outlet values, the modeling module 112 can obtain an optimized design of the data centre for favourable cooling. In an implementation, the modeling module 112 can compute and determine the optimum flow-parameters for the data centre and the components design based on the final outlet values of the flow parameters.

Figure 2:
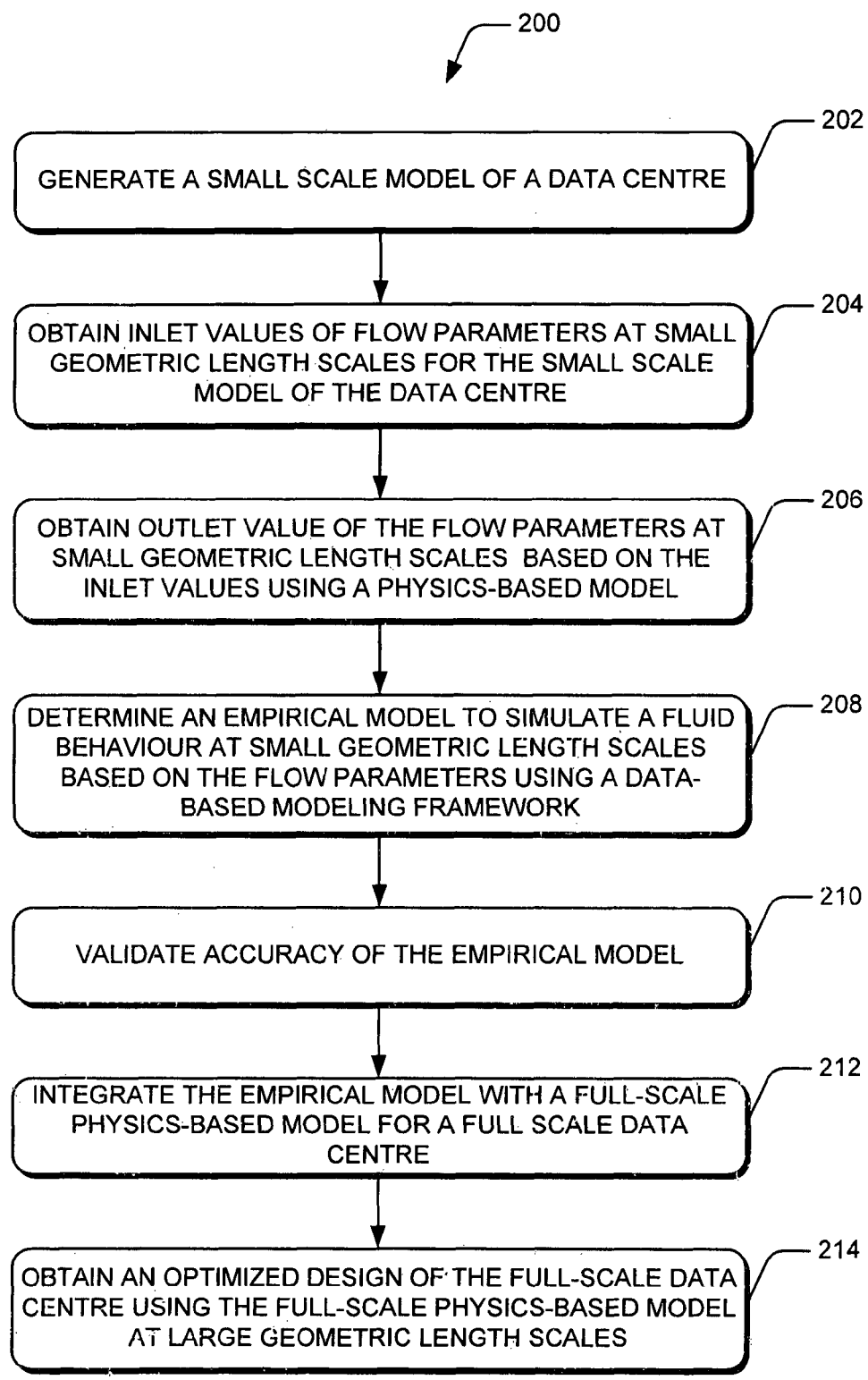
FIG. 2 illustrates a method for achieving design optimization for cooling, in accordance with an embodiment of the present subject matter.

FIG. 2 illustrates a method 200 for achieving an optimized design of a data centre for cooling, according to different implementation of the present subject matter. In one example, the method 200 is carried out by the design optimization system 100. The method may be described in the general context of computer executable instructions. Generally, computer executable instructions can include routines, programs, objects, components, data structures, procedures, modules, functions, etc., that perform particular functions or implement particular abstract data types. The method may also be practiced in a distributed computing environment where functions are performed by remote processing devices that are linked through a communications network. In a distributed computing environment, computer executable instructions may be located in both local and remote computer storage media, including memory storage devices.

The order in which the method is described is not intended to be construed as a limitation, and any number of the described method blocks can be combined in any order to implement the method, or an alternative method. Additionally, individual blocks may be deleted from the method without departing from the spirit and scope of the subject matter described herein. Furthermore, the methods can be implemented in any suitable hardware, software, firmware, or combination thereof.

Referring to FIG. 2, at block 202, a small-scale model of the data centre is generated. In one example, the determination module 110 requests measurement inputs from a user. The measurement inputs can include, for example, scaled down values of area of the data centre and size of equipment racks in the data centre, and measure of plenums, ducts, vents, and vent-tiles with actual perforations, in a cooling system of the data centre. In another example, the measurement values provided as input to the determination module 110 can include actual measured value. In such a case, the determination module 110 can request for a reduction ratio for scaling down the measures and achieving a small scale model of the data centre.

At block 204, inlet values of flow parameters at small geometric length scales are obtained. The flow parameters can include those thermal properties and flow properties that affect the cooling ability of a cooling medium in the data centre. For example, the flow parameters can include actually measured values of temperature and humidity, actual flow rates and velocities of the cooling medium measured along different directions in 3-dimensional space, and pressure conditions, measured at predetermined locations in the small-scale model of the data centre. Further, the predetermined locations for the measurement of the flow parameters in the data centre can be at chip level and at each vent-tile. In an example, the determination module 110 requests the user to provide inlet values of the flow parameters. In another example, the design optimization system 100 can be connected to various sensors to obtain the inlet values of the flow parameters to the determination module 110. As will be understood, the inlet values are values of the flow parameters measured at the inlets of the above mentioned locations. Further, the inlet values of the flow parameters obtained at block 204 is for small geometric length scales.

At block 206, outlet values of the flow parameters for the small-scale model of the data centre, i.e., at small geometric length scale, are determined based on the inlet values of the fluid obtained at block 202. In one example, the determination module 110 implements a physics-based model for determining the outlet values of the flow parameters from the inlet values of the flow parameters. The physics-based model can, in said example, be a computational fluid dynamics (CFD) model, which is based on various relations of fluid dynamics, such as the Average Reynold Stokes equation. The CFD model can also be based on modified versions of the relations of fluid dynamics, such as the Average Reynolds Stokes equation ignoring the energy coefficient.

At block 208, an empirical model is determined to simulate a fluid behaviour at small geometric length scales. For example, the modeling module 112 determines the empirical model to simulate the fluid behaviour at small geometric length scales based on the inlet and outlet values of the flow parameters. In an implementation, the inlet and outlet values of the flow parameters are provided as input to a data-based modeling framework, such as an artificial neural network (ANN) based model. Based on the input, the data-based modeling framework simulates or trains the empirical model which demonstrates the fluid behaviour. For example, based on the inlet and outlet values of the flow parameters, the data-based modeling framework can determine one or more correlations or weightage at various levels of the empirical model and their respective coefficients, which satisfy the inlet and outlet conditions at different locations in the data centre. In said example, the correlations and the various coefficients determined by the data-based modeling framework depict the simulated fluid behaviour at low geometric length scales.

Once, the fluid behaviour is modeled, at block 210, the modeled fluid behaviour, i.e., the empirical model, is checked for correctness and accuracy. In one example, the validation module 114 selects one or more correlations from the correlations of the empirical model determined by modeling module 112 and compares the results of empirical model against the selected simulated flow behaviour. In an example, available flow data, including inlet and outlet values of the flow parameters, is divided into two parts, viz., test data and validation data. In said example, the test data includes the inlet values and the validation data includes the outlet values of the flow parameters. In an implementation, the empirical model is provided with the inlet values of the flow parameters, as obtained at block 202, as input, and the outlet values are computed by the empirical model. The output from the empirical model is compared to the available outlet values of the flow parameters from the model simulated data. Based on the comparison of the outlet values from the empirical model and the available outlet values, the correctness and accuracy of the empirical model is determined. In one example, when the difference between the two outlet values of the flow parameters is within a predetermined range of error tolerance, the empirical model is ascertained to be correct and accurate. With the validation of the empirical model, the correctness and accuracy of the simulated fluid behaviour is also achieved.

Subsequent to the testing of the simulated fluid behaviour, the simulated flow behaviour is integrated with a full-scale physics-based model at block 212. In an example, the modeling module 112 can embed the empirical model in the full-scale physics-based model to integrate the fluid behaviour with the full-scale physics-based model for a full-scale data centre, i.e., at large geometric length scale. The full-scale physics-based model can be understood to consider small geometric length scales without any details. For example, the full-scale physics-based model may incorporate computation at the vent tiles without considering the perforations of the vent tile.

Further, at block 214, the full-scale physics-based model is used to achieve a design optimization in terms of cooling of the full-scale data centre at large geometric length scales. In an implementation, to achieve the design optimization of the full-scale data centre, the modeling module 112 obtains input values of flow parameters for large geometric length scales. In one example, the input values are obtained from the calculated values of the flow parameters at the inlet of the concerned part of the data centre, for example, the equipment racks, and the plenums. In another example, the modeling module 112 can obtain actual measured values of the data centre, the equipment racks, and the plenums, ducts, vents, and vent tiles of the cooling system for obtain the input values for large geometric length scales. Further, in said example, the actual values of temperature and humidity, actual flow rates and velocities of the cooling medium measured along different directions in 3-dimensional space, and pressure conditions can be obtained as part of flow parameters for large geometric length scale.

Further, the integrated physics-based model is provided with the input values of the flow parameters for large geometric length scales, and is used to determine the outlet values of the flow parameters for a full-scale data centre. In one implementation, the outlet values of the flow parameters are computed based on the correlations of the empirical model integrated into the full-scale physics-based model. Based on the outlet values of the flow parameters, the optimized design of the data centre and other components, such as the cooling system, is obtained. For example, the outlet values of the flow parameters is used to compute the geometry and layout of the equipment racks of the data centre and the geometry and size of the ducts, plenums, vents, and vent-tiles of the cooling system of the data centre.

Figure 3A:
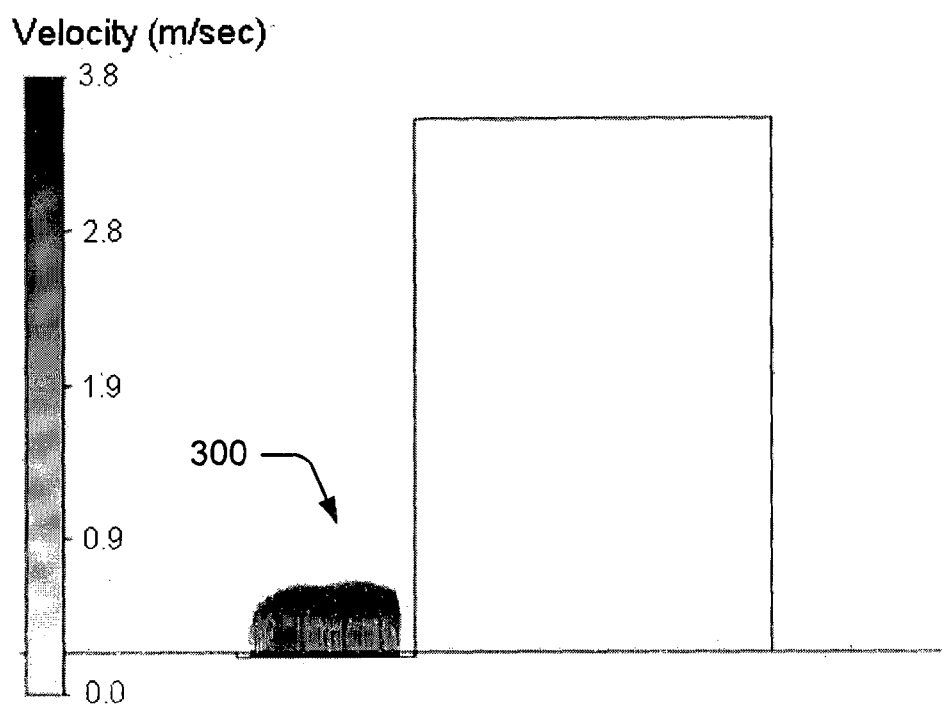
FIGS. 3(a), 3(b), and 3(c) illustrate different graphs plotting flow behaviour in data centres, according to an embodiment of the present subject matter.

FIG. 3(*a*), FIG. 3(*b*), and FIG. 3(*c*) illustrate different graphs plotting flow behaviour on the y-axis, against a physical location of component at which the velocity vector is computed on the x-axis, in accordance with an embodiment of the present subject matter. In one example, FIG. 3(*a*), FIG. 3(*b*), and FIG. 3(*c*) illustrate the flow behaviour in a data centre computed in terms of velocity vectors. In said example, the component, at which the velocity vector is computed, can be vent-tile. In one implementation, FIG. 3(*a*) and FIG. 3(*b*) illustrate the velocity vectors as computed using conventional techniques, and FIG. 3(*c*) illustrates the velocity vectors as computed according to the present subject matter.

FIG. 3(*a*) illustrates graph 300, which plots the flow behaviour in the data centre using a physics-based model at small geometric length scales when all the specific details of the concerned parts are considered such as perforations of the vent-tile. As mentioned earlier, in an example, the velocity vectors are computed to depict the flow behaviour in the data centre. The physics-based model can, in one example, be the CFD based model.

As can be seen from graph 300, the velocity vectors are vertical. The graph 300 depicts accurate flow behaviour in the small-scale data centre, which is almost same as the actual flow behavior since in this case all the small length scales are considered. In such a case, the mesh number, however, subsumes a large value even for small-scale data centre, since the data centre is broken down into large number of numerical grids to enable computations at small geometric length scales. Because of the use of a large number of numerical grids, use of this approach to a large-scale data centre involves large computational resources and time.

Therefore, the conventional technique for computing the velocity vectors involving physics-based analysis by appropriately considering both small and large geometric length scales provides an accurate calculation of the flow behaviour, but utilizes a large amount of computational resources at the same time.

Figure 3B:
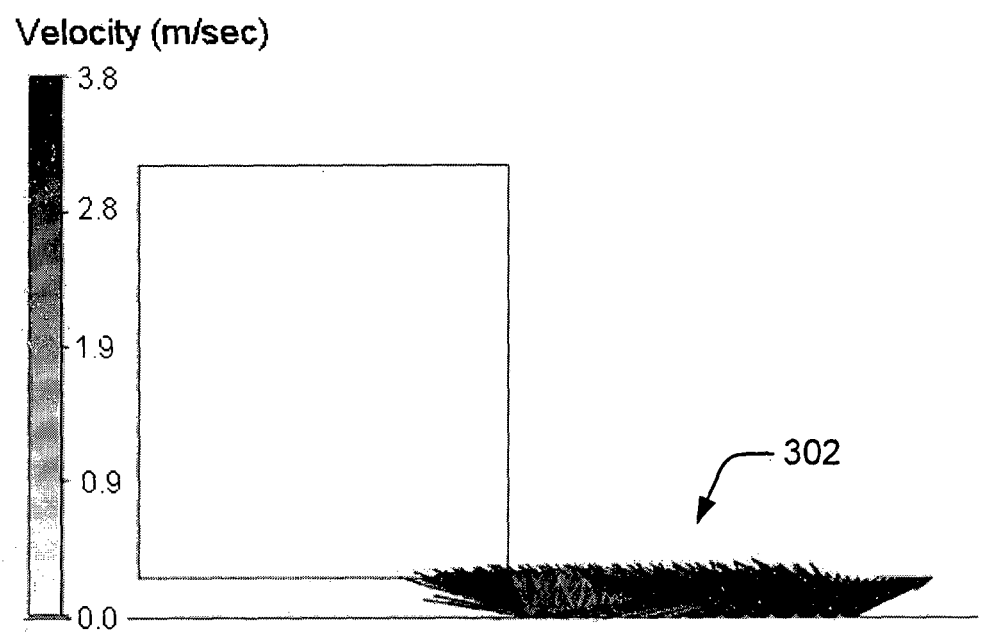

FIG. 3(b) illustrates graph 302 plotting the flow behaviour in the data centre using a physics-based model. The velocity vectors are computed at a large geometric length scale using the physics-based model. However, the flow behaviour at smaller length scale is not considered and approximate models are used for critical regions. In such a case, the computation of the velocity vectors involve less computational resources and time, because the computation selects fewer number of numerical grids for computations at key locations using large geometric length scale. As will be understood, the mesh number depicts size of a numerical grid.

As can be seen from graph 302, the velocity vectors depicted by the curve are substantially inclined with respect to the vertical axis and exhibit a distributed layout. These results do not compare well with graph 300, which depicts the actual flow behavior. Graph 302 usually depicts non-physical flow behaviour and lacks accuracy in depicting the actual flow behaviour in the data centre. Hence, the generation of the graph 302 using physics-based model for computing the velocity vector lacks accuracy and precision although it uses less computational resources and time.

Figure 3C:
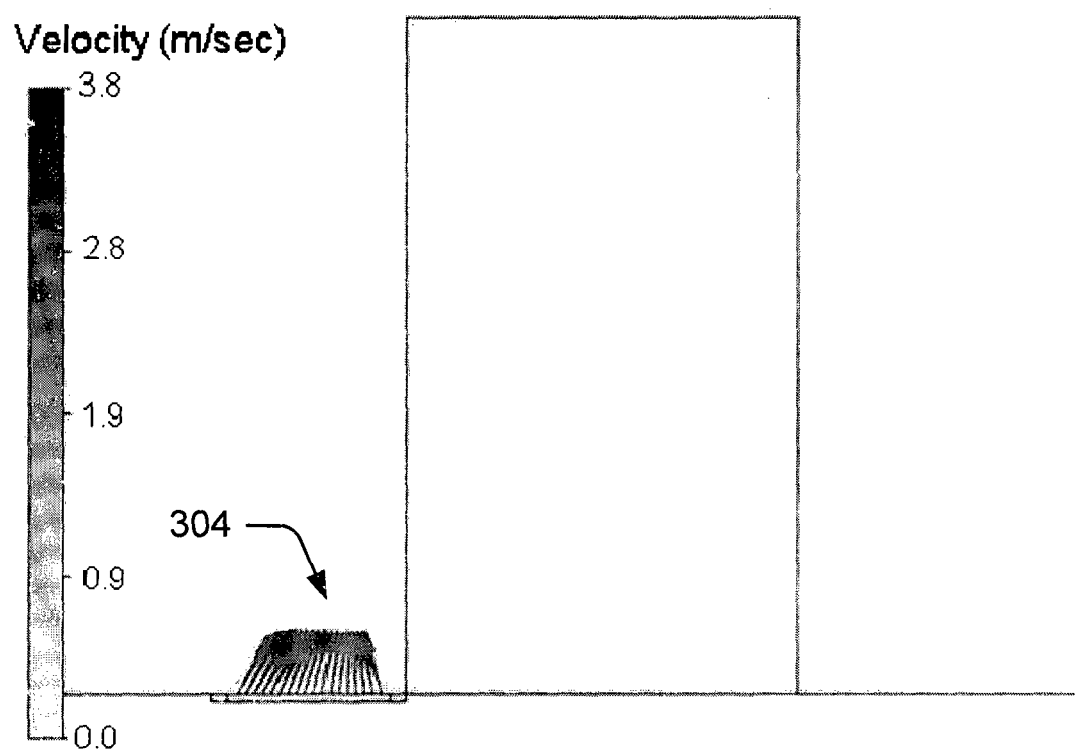

Graph 304 shown in FIG. 3(c) illustrates the flow behaviour in the data centre, as simulated according to an implementation of the present subject matter. According to said implementation, the flow behaviour is calculated at small geometric length scales, by simulating velocity vectors using the physics-based model. Further, the results of the physics-based model are used to develop and train an empirical model, such as an ANN based model, to mimic the results of the physics-based analysis at small geometric length scales. Further, the empirical model is integrated with the physics-based model and used to simulate the flow behaviour at the large geometric length scales.

The use of the ANN based model for small geometric length scales to obtain an accurate simulation of the flow behaviour at smaller length scales improves the accuracy of the computed flow behaviour. This is illustrated by the graph 304, where the velocity vectors are vertical. When compared with the graphs obtained for computations made using conventional techniques, graph 304 is similar to graph 300, which depicts almost accurate flow behaviour. Since in the said implementation the mesh number is small, it requires less computation time.

Further, with the use of simulated results of computation at small geometric length scales for obtaining the results at large geometric length scale using different models, the expenditure of the computational resources and time is reduced.

Table 1, shown below compares the above discussed techniques in terms of the time and computational resources used by each of the technique for computing the flow behavior.

| Case | Time taken to converge to solution (in seconds) | Mesh number |
| --- | --- | --- |
| Physics-based model applied at small length with the specific details taken into account | ~1,00,000 | ~8,00,000 |
| Physics-based model applied at large geometric length scales and values approximated for small geometric length scales | ~10,000 | ~75,000 |
| Physics-based model applied at small geometric length scale and the empirical model trained using the results is integrated with the physics-based model and applied at large geometric length scales | ~11,000 | ~75,000 |

Table 1, as shown above, depicts the computational time taken for convergence or to obtain the solution, and the mesh number in each case described above. As is elucidated in the table, first row depicts the case when the computation of flow behaviour is computed by applying the physics-based model for small geometric length scale computations and inclusion of specific details for the part having small geometric length scale. In such a case, the mesh number is about $8 \times 10^5$ which depicts that the data centre is broken down into a large number of reference grids to compute the flow behaviour. In an implementation, the time taken for obtaining the flow behaviour is about $10^5$. Hence, the computational resources and time involved in such cases are large, owing to the large value of mesh number.

Second row of Table 1 illustrates the computational time expended using the physics-based model for computing the flow behaviour at large geometric length scales and approximating the flow behaviour at the small geometric length scales. In such a case, the mesh number has a value of about $75 \times 10^3$. Further, since the data centre is split into small number of grids, depicted by the small mesh number, the time taken for obtaining the complete flow behavior is about $10^4$ seconds. However, in such cases, as depicted with reference to FIGS. 3(a), 3(b), and 3(c), the accuracy of the computed flow behaviour is compromised.

Third row of Table 1 illustrates the computational time taken in obtaining the flow behaviour, according to an implementation of the present subject matter. As it is clear from the table, the mesh number has a value of about $75 \times 10^3$, and the time expended in obtaining the complete flow behavior in the data centre is about $11 \times 10^3$ seconds. Hence, with reference to FIGS. 3(a), 3(b), and 3(c) and Table 1, it is understood that the method and systems according to the present subject matter utilize less computational resources and time in achieving the flow behaviour in the data centre. Therefore, the accuracy of the computation is achieved along with less expense of computational resources.

It will be understood that although the above description is provided with reference to the design optimization of a data centre for cooling, similar concepts can be used for achieving design optimization of other regions, such as offices and homes.

Although implementations for achieving design optimization for cooling have been described in a language specific to structural features and/or methods, it is to be understood that the present subject matter (and not appended claims) is not necessarily limited to the specific features or methods described. Rather, the specific features and methods for achieving design optimization of cooling are disclosed as implementations of the present invention.

We claim:

1. A computer implemented method for designing a data center optimized for cooling of components in the data center, the method comprising:
   generating, by a processor, a small geometric length scale model of the data center, wherein the small geometric length scale model includes geometrical specifications of a small component of the data center, the small component comprising at least one of a processor chip and vent-tile;
   ascertaining, by the processor, for the small geometric length scale model, outlet values of at least one flow parameter associated with a cooling medium, based on input inlet values of the at least one flow parameter and a fluid dynamics simulation of circulation of the cooling medium in the small geometric length scale model;
   determining, by the processor, an empirical model indicative of fluid behaviour of the cooling medium in the small geometric length scale model using a data-based modeling framework, based on the input inlet values and the ascertained outlet values of the at least one flow parameter;
   generating, by the processor, a full-scale physics-based model based on a full-scale model of the data center, the full-scale physics based model being indicative of geometry of a full-scale of the components of the data center without the geometrical specifications of the small component;
   integrating, by the processor, the empirical model with the full-scale physics-based model to obtain an integrated physics-based model for simulating fluid flow behaviour of the cooling medium in the data center;
   determining, by the processor, full-scale outlet values of the at least one flow parameter of the cooling medium for the data center, based on inlet values of the at least one flow parameter in the data center and the integrated physics-based model, for optimizing the data center for cooling of the components; and
   wherein integrating the empirical model further comprises validating the empirical model comprising:
      selecting the at least one correlation;
      providing test data as input to the at least one correlation, wherein the test data comprises inlet values of the at least one flow parameter;
      determining test outlet values of the at least one flow parameter, based on the at least one correlation and the test data; and
      comparing the test outlet values with ascertained outlet values of the at least one flow parameter to validate the empirical model.

2. The method as claimed in claim 1, wherein the ascertaining the outlet values comprises simulating fluid flow behaviour in the small geometric length scale model, using a physics-based model.

3. The method as claimed in claim 2, wherein the physics-based model is a computational fluid dynamics (CFD) based model.

4. The method as claimed in claim 1, wherein the determining the empirical model comprises ascertaining at least one correlation and one or more coefficients of the at least one correlation, based on the inlet values and the outlet values of the at least one flow parameter.

5. The method as claimed in claim 1, wherein the data-based modeling framework is an artificial neural network (ANN)-based model.

6. A design optimization system for designing a data center, the design optimization system comprising:
   a processor; and
   a memory coupled to the processor, the memory comprising,
      a determination module configured to,
         generate a small geometric length scale model of the data center, wherein the small geometric length scale model includes geometrical specifications of a small component of the data center, the small component comprising at least one of a processor chip and vent-tile;
         ascertain, for the small geometric length scale model, outlet values of at least one flow parameter associated with a cooling medium, based on input inlet values of the at least one flow parameter and a fluid dynamics simulation of circulation of the cooling medium in the small geometric length scale model; a modeling module configured to:
      determine an empirical model indicative of fluid behaviour of the cooling medium in the small geometric length scale model using a data-based modeling framework, based on the input inlet values and the ascertained outlet values of the at least one flow parameter;
      generate a full-scale physics-based model based on a full-scale model of the data center, the full-scale physics based model being indicative of geometry of a full-scale of the components of the data center without the geometrical specifications of the small component;
      integrate the empirical model with the full-scale physics-based model to obtain an integrated physics-based model for simulating fluid flow behaviour of the cooling medium in the data center;
      determine full-scale outlet values of the at least one flow parameter of the cooling medium for the data center, based on inlet values of the at least one flow parameter in the data center and the integrated physics-based model, for optimizing the data center for cooling of the component;
      select a primary flow parameter from the at least one flow parameter; and
      determine the empirical model based on the selected primary flow parameter using the data-based modeling framework.

7. The design optimization system as claimed in claim 6, wherein the determination module is configured to:
   obtain the inlet values of the at least one flow parameter in the small geometric length scale model of a data center; and
   compute the outlet values of the at least one flow parameter in the small geometric length scale model of a data center based on a computational fluid dynamics (CFD) based model.

8. The design optimization system as claimed in claim 6, further comprising a validation module configured to validate an accuracy of the empirical model determined by the modeling module, wherein the validation module is configured to:
   determine test outlet values of the at least one flow parameter, based on test data and the empirical model;
   compare the test outlet values with available outlet values of the at least one flow parameter computed by the modeling module; and
   validate the accuracy of the empirical model based on the comparison.

9. A non-transitory computer-readable medium having a set of computer readable instructions that, when executed, perform acts comprising:
   generating a small geometric length scale model of a data center, wherein the small geometric length scale model includes geometrical specifications of a small component of the data center, the small component comprising at least one of a processor chip and vent-tile;
   ascertaining for the small geometric length scale model, outlet values of at least one flow parameter associated with a cooling medium, based on input inlet values of the at least one flow parameter and a fluid dynamics simulation of circulation of the cooling medium in the small geometric length scale model;
   determining an empirical model indicative of fluid behaviour of the cooling medium in the small geometric length scale model using a data-based modeling framework, based on the input inlet values and the ascertained outlet values of the at least one flow parameter;
   generating a full-scale physics-based model based on a full-scale model of the data center, the full-scale physics based model being indicative of geometry of a full-scale of the components of the data center without the geometrical specifications of the small component;
   integrating the empirical model with the full-scale physics-based model to obtain an integrated physics-based model for simulating fluid flow behaviour of the cooling medium in the data center;
   determining full-scale outlet values of the at least one flow parameter of the cooling medium for the data center, based on inlet values of the at least one flow parameter in the data center and the integrated physics-based model, for optimizing the data center for cooling of the component; and
   wherein integrating the empirical model further comprises validating the empirical model comprising:
      selecting the at least one correlation;
      providing test data as input to the at least one correlation, wherein the test data comprises inlet values of the at least one flow parameter;
      determining test outlet values of the at least one flow parameter, based on the at least one correlation and the test data; and
      comparing the test outlet values with ascertained outlet values of the at least one flow parameter to validate the empirical model.

* * * * *